(12) United States Patent
Kodani et al.

(10) Patent No.: US 7,105,932 B2
(45) Date of Patent: Sep. 12, 2006

(54) POWER SEMICONDUCTOR MODULE

(75) Inventors: Kazuya Kodani, Kawasaki (JP);
Nobuhiro Shingai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 10/870,061

(22) Filed: Jun. 18, 2004

(65) Prior Publication Data

US 2005/0230807 A1 Oct. 20, 2005

(30) Foreign Application Priority Data

Apr. 16, 2004 (JP) .............................. 2004-122181

(51) Int. Cl.
*H01L 29/15* (2006.01)
*H01L 31/256* (2006.01)

(52) U.S. Cl. ........................................ 257/784; 257/76

(58) Field of Classification Search .................. 257/76, 257/198, 705, 784, 787
See application file for complete search history.

(56) References Cited

U.S. PATENT DOCUMENTS

| | | | |
|---|---|---|---|
| 4,849,803 A * | 7/1989 | Yamamoto et al. ......... | 257/687 |
| 5,386,342 A * | 1/1995 | Rostoker ..................... | 361/749 |
| 5,969,414 A * | 10/1999 | Parthasarathi et al. ...... | 257/675 |
| 6,605,779 B1 * | 8/2003 | Takata et al. ............... | 174/52.2 |
| 2004/0021212 A1 * | 2/2004 | Hamaguchi et al. ........ | 257/686 |
| 2004/0042186 A1 * | 3/2004 | Furukawa et al. .......... | 361/760 |
| 2004/0070059 A1 * | 4/2004 | Hori et al. .................. | 257/678 |
| 2004/0248330 A1 * | 12/2004 | Kitabatake et al. ........... | 438/17 |

FOREIGN PATENT DOCUMENTS

| JP | 6-302639 | 10/1994 |
|---|---|---|
| JP | 8-8288 | 1/1996 |
| JP | 2000-340597 | 12/2000 |
| JP | 2002-222826 | 8/2002 |

* cited by examiner

*Primary Examiner*—S. V. Clark
(74) *Attorney, Agent, or Firm*—Oblon, Spivak, McClelland, Maier & Neustadt, P.C.

(57) ABSTRACT

A power semiconductor module comprises a wide band gap semiconductor chip having its surface with an electrode provided thereon, and more than one bonding wire which is connected to an edge portion of the electrode directly or indirectly via an electrode pad. The electrode and the electrode pad have their thickness values that are specifically set in such a way as to obtain a conduction area ratio equal to or greater than a conduction area ratio of the wide band gap semiconductor chip in the case where a respective one of the electrode and electrode pad is made of aluminum while letting a total thickness value of the electrode and the electrode pad measure ten micrometers (10 μm).

8 Claims, 13 Drawing Sheets

(□5mm SiC-SBD + φ250 μm Al Wire + 5 μm Al Pad + CENTER)

(□5mm SiC-SBD + φ250 μm Al Wire + 5 μm Al Pad+END)

(□5mm SiC-SBD + φ250 μm Al Wire + 10 μm Al Pad+END)

(☐5mm SiC-SBD + φ250 μm Al Wire + 20 μm Al Pad+END)

(☐5mm SiC-SBD + φ250 μm Al Wire + 100 μm Al Pad+END)

(□7mm SiC-SBD+φ250μm+5μm Al Pad+CENTER)

(□7mm SiC-SBD+φ250μm+5μm Al Pad+END)

(□7mm SiC-SBD+φ250μm+10μm Al Pad+END)

(□7mm SiC-SBD+φ250μm+20μm Al Pad+END)

(□7mm SiC-SBD + φ250μm + 100μm Al Pad + END)

(□5mm SiC-SBD + φ500 μm + 5 μm Al Pad + CENTER)

(□5mm SiC-SBD + φ500 μm + 5 μm Al Pad + END)

(□5mm SiC-SBD + φ500 μm + 10 μm Al Pad + END)

TOTAL THICKNESS OF ELECTRODE PAD 20 AND ELECTRODE SURFACE 2 [μm]

(□5mm SiC-SBD+φ250μm+5μm Al Electrode+10μm MO Pad+END)

(□5mm SiC-SBD+φ250μm+5μm Al Electrode+30μm MO Pad+END)

POWER SEMICONDUCTOR MODULE

CROSS-REFERENCE TO PRIOR APPLICATION

This application is based upon and claims the benefit of priority from the prior Japanese Patent Application No. 2004-122181, filed on Apr. 16, 2004, the entire content of which is incorporated herein by reference.

BACKGROUND OF THE INVENTION

1. Field of the Invention

The present invention relates to power semiconductor modules having a wire bonding structure.

2. Description of the Related Art

Power semiconductor switching devices for use in power conversion apparatus such as an inverter include a widely known power semiconductor module which has more than one power semiconductor circuit element sealed within an electrically insulated housing. Typically a power semiconductor module is used for applications with high voltage (600 to 6,500 V) and large current (50 to 3,600 A). Such module is generally made up of a plurality of insulated gate bipolar transistors (IGBTs) and diodes, which are sealed together within the same package of such power semiconductor module. Electrode surfaces, main electrodes and control electrodes of IGBTs and diodes are connected by ultrasonic bonding techniques using diameter-increased or thick line (250 to 500 μm) aluminum bonding wires.

A major problem of the aluminum bonding wires in the power semiconductor module is that repeated flow of a large current results in a temperature rise-up and fall-down at a silicon chip and aluminum wires, which leads to creation of repeated thermal stress at the interface between the silicon chip and aluminum wire due to a difference in thermal expansion coefficient between silicon and aluminum. This stress causes unwanted progress of a crack at the interface. Thus there is a problem that the wire is physically broken and cut away in the worst case. Regarding this problem, it is shown that some improvements may be obtained by specifically designing the material and shape of such aluminum bonding wires (refer to JP-A-6-302639, for example).

In these power semiconductor modules, the rated current is determinable by Equation (1) which follows:

$$Tj - Tc = Rthjc \times Ic \times Vce(Ic) \quad (1)$$

where, Tj is the junction temperature, Tc is the temperature of a package housing or casing, Rthjc is the thermal resistance between the junction and the casing, Vce is the collector-emitter voltage of an IGBT, and Ic is the collector current of IGBT.

Considering about a silicon power semiconductor module which is currently the highest in current density, its loss density (loss per square centimeter) measures approximately 225 watts per square centimeter ($W/cm^2$), whereas the current density (current flow per unit area) of IGBT is about 125 amperes per square centimeter ($A/cm^2$).

In recent years, the loss density and the current density have been gradually improved with improvements in the junction-housing thermal resistance Rthjc and in the voltage Vce versus current Ic characteristics of IGBTs. A number of those thick-line aluminum bonding wires connectable per unit area is currently about sixteen (16) in maximum. In view of this, the flow of a conduction current per wire is 7.8 A.

Assuming that thick-line aluminum bonding wires are designed to measure 350 micrometers (μm) in diameter and 10 mm in length, a maximal level of a conduction current that is flowable per wire—known as a maximum conduction current—is 18.7 A. Accordingly, in the case of silicon power semiconductor modules, the relationship of the current density versus the maximum conduction current per bonding wire does not cause any serious problems.

However, in wide band gap semiconductor chips made of silicon carbides or else, the current density is much improved so that problems take place in the relationship between the current density and the wire's maximum conduction current. More specifically, in the case of silicon semiconductor modules, the maximum conduction current per bonding wire does not become problems at the time of proper operations. This merely pauses problems only in the event of occurrence of abnormal conditions, such as load shorting or the like. However in wide band gap semiconductor modules, a large current that is almost equal in magnitude tends to flow during normal operations. Thus, it is inevitably required to design the module structure per se by taking account of the maximum conduction current thereof. In order to increase the maximum conduction current per bonding wire, a currently available technique is to enlarge the diameter of bonding wire. Another technique is to lessen the length of such wire. Unfortunately, the former approach has a limit in increasing the wire diameter—its upper limit is approximately at 500 μm. This is due to the presence of the above-stated problems (i.e., the cracking risk due to a difference in thermal expansion coefficient, physical breakdown, and the like).

SUMMARY OF THE INVENTION

A power semiconductor module in accordance with one aspect of the present invention comprises a wide band gap semiconductor chip having a surface with an electrode provided thereon, and a bonding wire connected to an edge portion of the electrode directly or indirectly via an electrode pad, characterized in that the electrode and the electrode pad have thickness values determined in such a way as to obtain a conduction area ratio equal to or greater than a conduction area ratio of the wide band gap semiconductor chip in case a respective one of the electrode and the electrode pad is formed of aluminum while at the same time setting a total thickness value of the electrode and the electrode pad at 10 μm. Note here that the term "conduction area ratio" refers to the ratio of the area of a portion of the wide band gap semiconductor chip with respect to the whole area thereof, wherein the certain portion is the one at which the current density becomes equal to or greater than a specified value.

A power semiconductor module in accordance with another aspect of this invention comprises a wide band gap semiconductor chip having a surface with an electrode provided thereon, and a bonding wire connected to an edge portion of the electrode directly or indirectly via an electrode pad, featured in that the wide band gap semiconductor chip and the bonding wire are at least partially covered with a dielectric resin which is high in thermal conductivity.

A power semiconductor module in accordance with still another aspect of the invention comprises a wide band gap semiconductor chip having a surface with an electrode provided thereon, and a bonding wire connected to an edge portion of the electrode directly or indirectly via an electrode pad, wherein the wide band gap semiconductor chip and the bonding wire are at least partially covered with a dielectric resin that is high in thermal resistivity.

A power semiconductor module in accordance with a further aspect of the invention comprises a wide band gap semiconductor chip having a surface with an electrode provided thereon, a bonding wire as electrically connected to an edge portion of the electrode, and an electrode pad which is inserted between the electrode and the bonding wire.

DETAILED DESCRIPTION OF THE INVENTION

In this invention, a technique is employed for connecting, either directly or indirectly through an electrode pad, a bonding wire to an electrode which is provided on a top surface of a wide band gap semiconductor chip that is much greater in current density than silicon semiconductor element chips. Also in this invention, a scheme is used for connecting a bonding wire to an edge portion of an electrode on the wide band gap semiconductor chip (the portion must be away from the exact edge by 1.5 mm or more) and for retaining the length of such bonding wire as short as possible, thereby to increase the magnitude of a maximum conduction current per wire.

However, when the bonding wire is connected to the electrode edge portion, the resulting conduction area ratio decreases in the wide band gap semiconductor chip.

Therefore, in this invention, for the purpose of preventing such decrease in conduction area ratio, in cases where any one of the electrode and electrode pad is made of aluminum, a total thickness of the electrode and electrode pad is specifically set at 10 micrometers (μm) or greater. In case these are made of other metals, the thickness values of the electrode and electrode pad are designed in such a way that the resultant conduction area ratio becomes equivalent to that obtained when the total thickness of the aluminum-formed electrode and electrode pad was set at 10 μm. A similar arrangement is also usable when the electrode and electrode pad are made of different kinds of metals, respectively.

Figure 1:
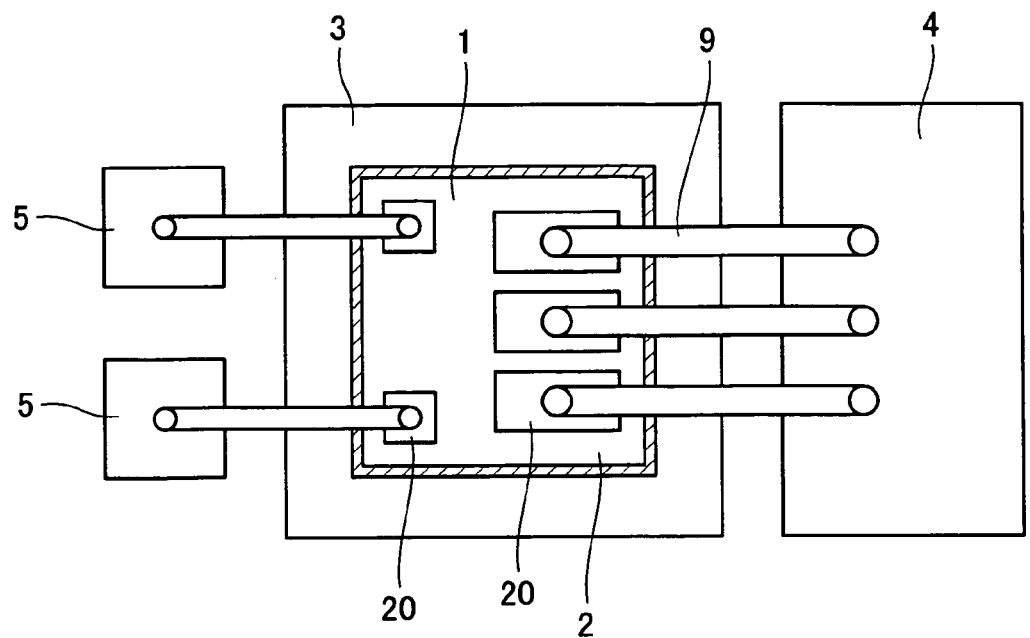
FIG. 1 is a diagram showing a plan view of a wide band gap semiconductor module in accordance with an embodiment of the present invention.
Figure 2:
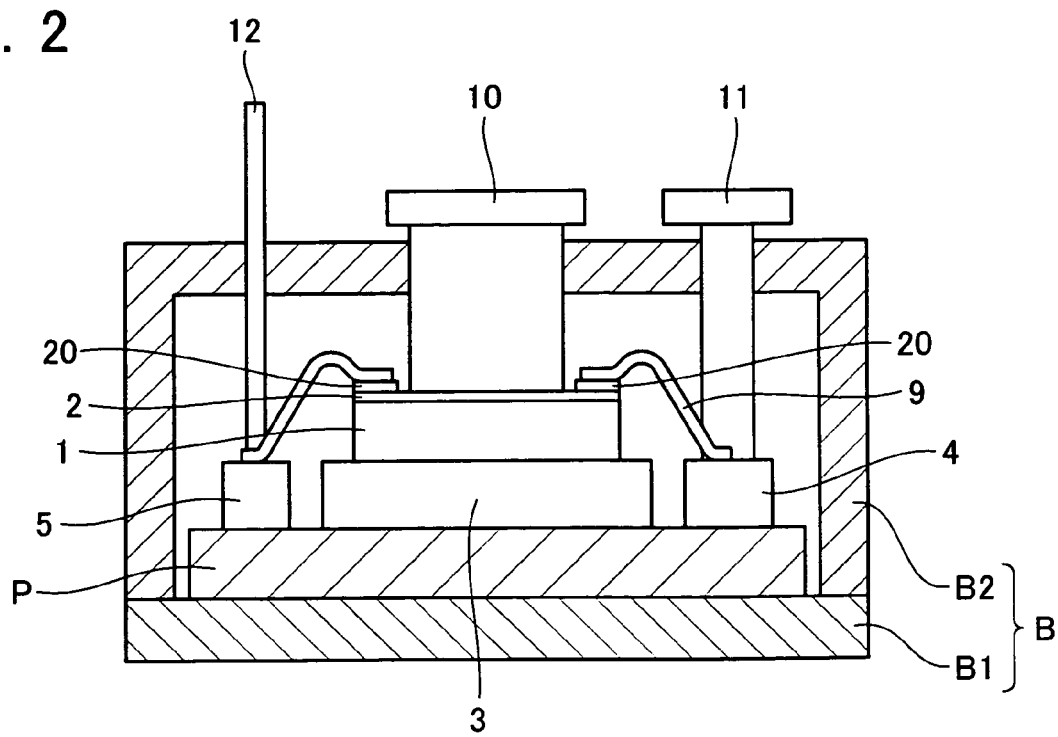
FIG. 2 is a cross-sectional view of the wide band gap semiconductor module shown in FIG. 1.

Next, a detailed explanation will be given of an embodiment of the invention with reference to FIGS. 1 through 6 below. FIG. 1 is a plan view of a wide band gap semiconductor module in accordance with one embodiment of the invention. FIG. 2 is its cross-sectional view. As shown in FIGS. 1 and 2, a wide band gap semiconductor chip 1 (simply referred to as "chip 1" hereinafter) of this wide band gap semiconductor module has an electrode surface 2 on the top surface side and also has a positive main electrode surface 3 on the bottom surface side. The chip 1 is mounted within a plastic package housing B (this includes a lower plate B1 and an upper box B2) with a dielectric plate P interposed therebetween.

On the dielectric plate P, a negative main electrode surface 4 and a control electrode surface 5 are formed in addition to the chip 1. The negative electrode surface 4 is connected to the electrode surface 2 by one or more bonding wires 9 (simply referred to hereinafter as the "wires 9").

Additionally, a positive main electrode terminal 10, a negative main electrode terminal 11 and a control electrode terminal 12 are taken from the positive electrode surface 3, the negative electrode surface 4 and the control electrode surface 5, respectively, to extend up to the outside of the plastic package B.

Figure 3:
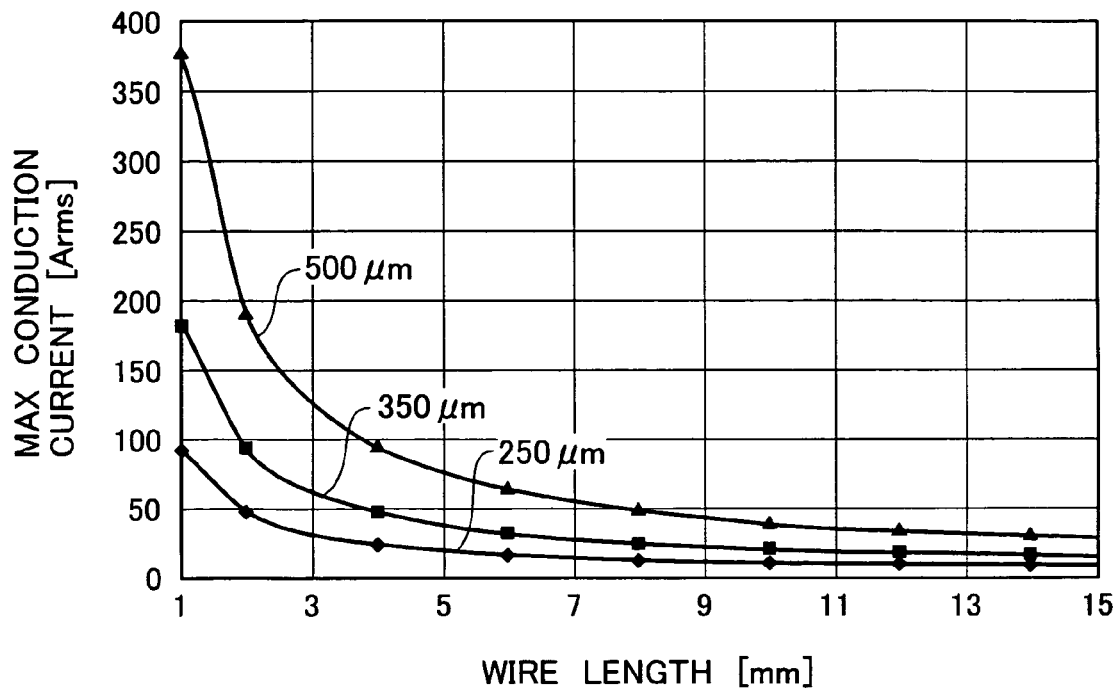
FIG. 3 is a graph showing a relationship of the length of a bonding wire 9 versus maximum conduction current per bonding wire 9.

A graph of FIG. 3 shows a relationship of the length of a wire 9 versus the maximum conduction current. As apparent from this graph, the shorter the wire length, the larger the maximum conduction current. In addition, when the wire becomes greater in diameter or "thickness," it is possible to enlarge the maximum conduction current even when the wire is of the same length. In view of this fact, in the illustrative embodiment, in order to shorten the wire 9 to thereby increase the maximum conduction current per wire, the electrode pad 20 is formed at the edge portion of the electrode surface 2. Note here that the term "edge portion" is used herein to mean a position which permits minimization of the length of wire 9 by taking into consideration the limits in bonding processes (about 1.5 mm as measured from the end face of the chip 1 under existing circumstances).

Figure 4:
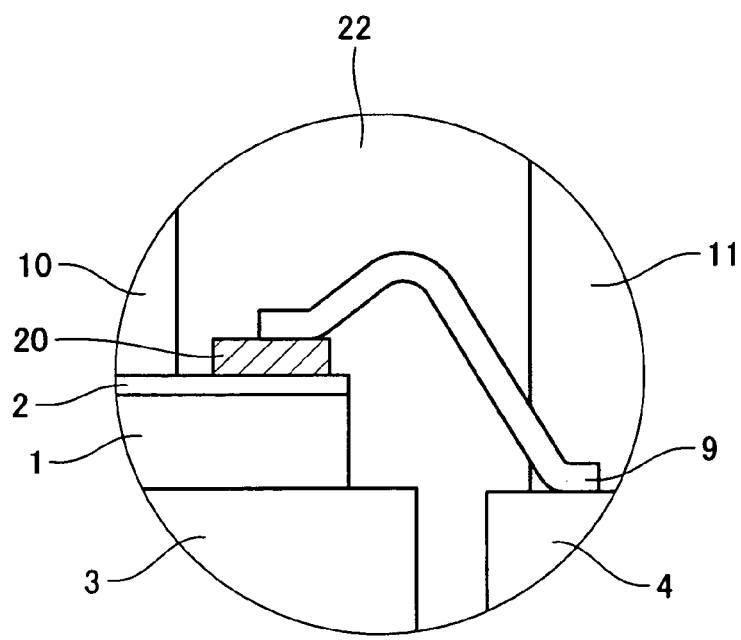
FIG. 4 is an enlarged view of a connection part of a bonding wire 9 and an electrode surface 2 in the wide band gap semiconductor module shown in FIG. 1.
Figure 5:
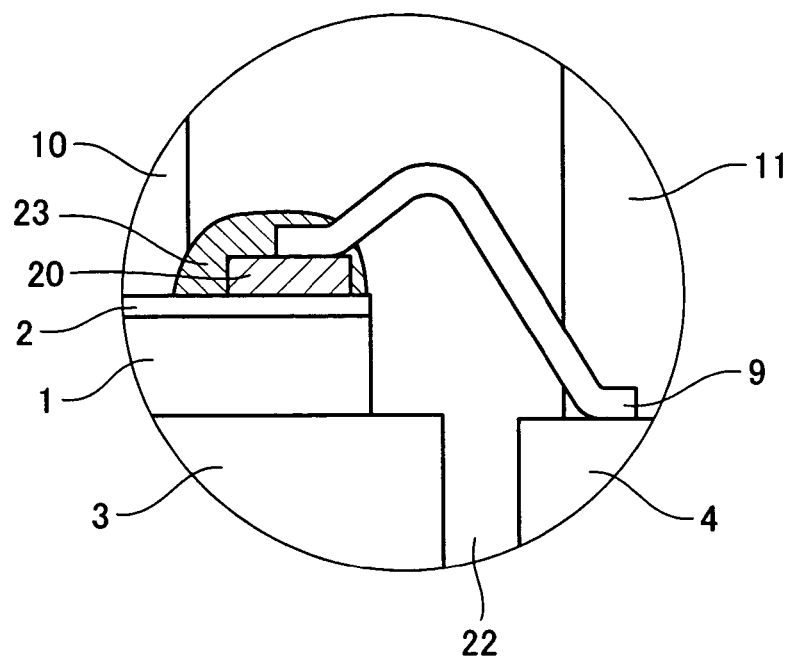
FIG. 5 is an enlarged view of another exemplary connection part of a bonding wire 9 and an electrode surface 2.
Figure 6:
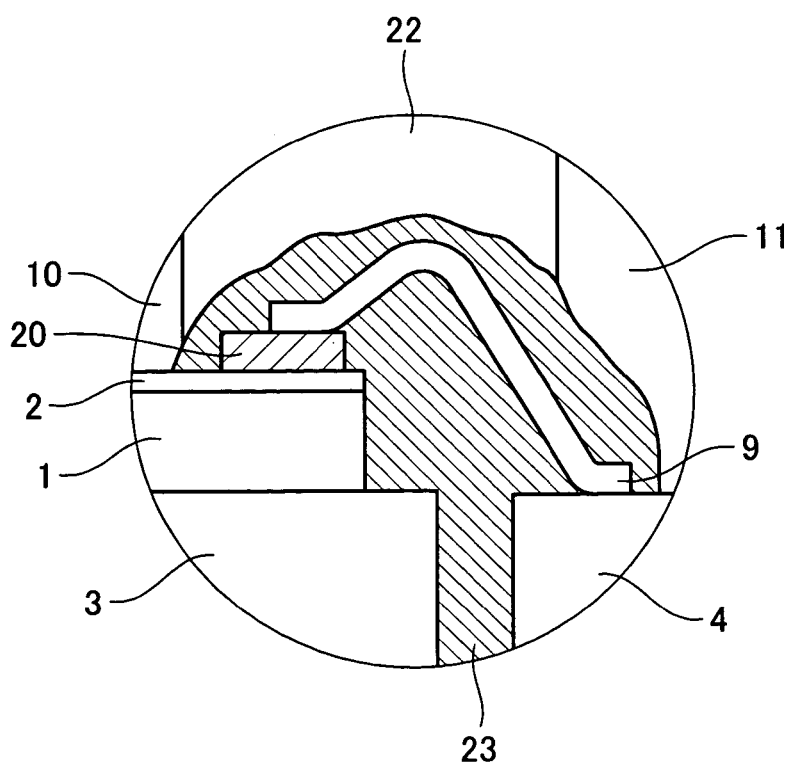
FIG. 6 is an enlarged view of still another exemplary connection part of a bonding wire 9 and electrode surface 2.

As shown by an enlarged view in FIG. 4, the electrode pad 20 is interposed between the wire 9 and the electrode surface 2. This electrode pad 20 is connected to the wires 9 by ultrasonic bonding techniques. As shown in FIG. 4, the wire 9 is covered with a dielectric resin material 22 with high thermal conductivity, such as an insulative gel or the like, thereby enhancing heat release effects. Alternatively this may be arranged in a way which follows: as shown in FIG. 5, a dielectric resin material 23 with high heat-resistant temperature, such as epoxy resin or else, is further formed around a connection point of the electrode pad 20 and wire 9; and, the dielectric resin 22 is formed on the upper part of this resin. Still alternatively, as shown in FIG. 6, this dielectric resin 23 may be formed on the entire part that also includes nearby portions of the connection point between the negative electrode surface 4 and wire 9, with the dielectric resin 22 being formed from the upper part of it.

Figure 7:
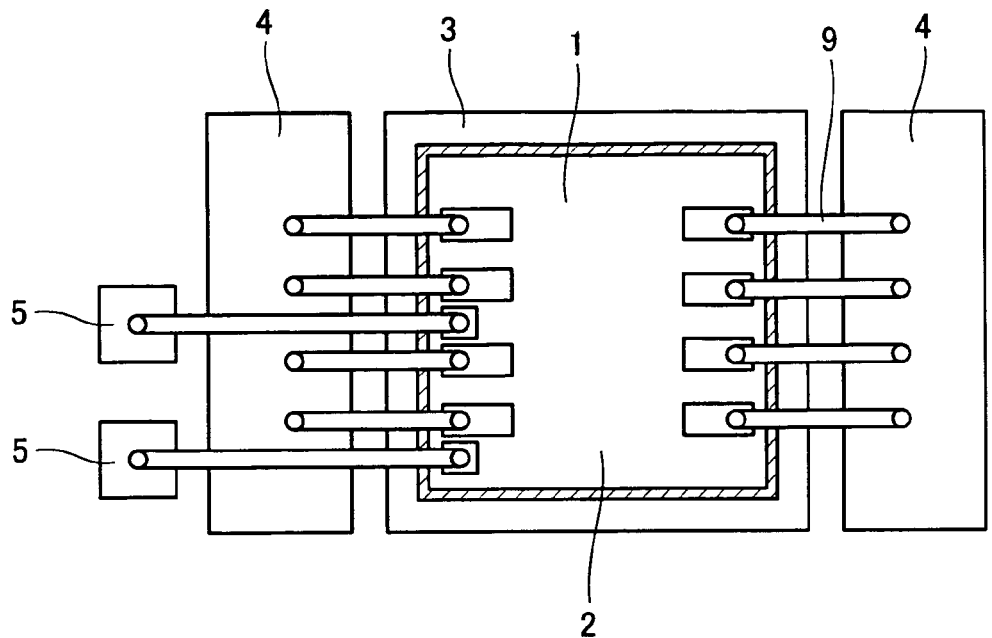
FIG. 7 is a plan view of a modified example of the wide band gap semiconductor module in accordance with the embodiment of this invention.

It should be noted that although in FIGS. 1–2 the negative electrode surface 4 is formed only on one side of the chip 1 with the wires 9 being extended from only the one side of chip 1, this may be modified in a way as shown in FIG. 7, wherein negative electrode faces 4 are provided on both sides, i.e. the right and left sides, of the chip 1 while letting wires 9 extend from the both sides of the right and left sides of chip 1.

Other approaches to shortening the length of wire 9 are available in this embodiment, including the following:
(1) minimizing the distance between the main electrodes 3 and 4, and
(2) maximally lowering the loop height of the wires 9.

Whereby, it becomes possible, in the case of the chip 1 with its size of about 5×5 mm, to reduce the length of the wires 9 to about 8 mm or less.

However, when more than one bonding wires are connected to an edge portion(s) of the electrode surface 2, the ratio of a portion with its current density becoming greater than or equal to a prespecified value with respect to the area of an entire surface of the chip 1—that is, the conduction area ratio—decreases in the wide band gap semiconductor chip 1.

This will be explained by using FIG. 8 and FIG. 9.

Figure 8:
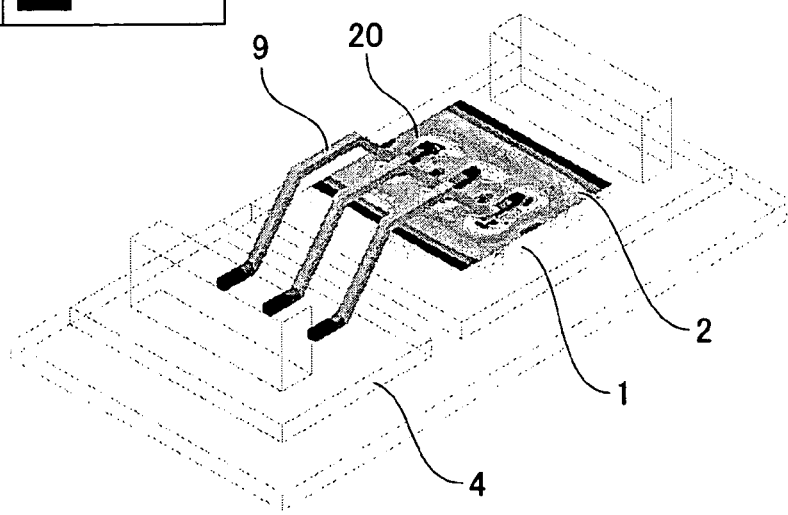
FIG. 8 shows a simulation result of a current density distribution state.
Figure 9:
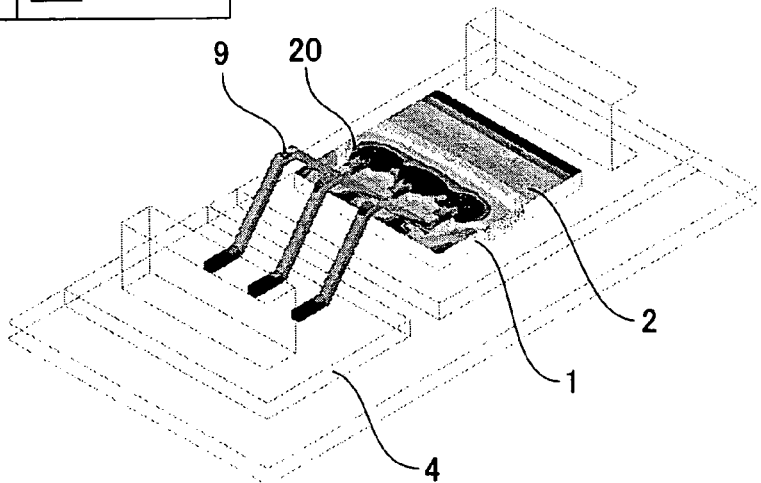
FIG. 9 shows a simulation result of a current density distribution state.

FIG. 8 shows a simulation result of a current density distribution state in a case where wires 9 are connected via electrode pads 20 to almost central portions of the electrode surface 2 of the wide band gap semiconductor chip 1. FIG. 9 shows a simulation result of a current density distribution state in case wires 9 are connected via electrode pads 20 to edge portions of the electrode surface 2 of wide band gap semiconductor chip 1. In both FIG. 8 and FIG. 9, simulation was done under the assumption which follows: the size of wide band gap semiconductor chip 1 is 5 mm×5 mm; the wires 9 are made of aluminum; each wire measures 250 mm in diameter of cross-section; any one of the electrode pads 20 and the electrode surface 2 is made of aluminum; and, a total thickness thereof is 5 μm.

For example, suppose that a current of 100 A flows in the chip 1 as a whole. Define as the "conduction area ratio" a ratio of a certain portion, at which the average current density value of 4.00 A/mm$^2$ and the minimum value of 3.75 A/mm$^2$ are obtained, with respect to the area of an entire surface of the chip 1. Then, in the case of FIG. 8, the conduction area ratio becomes 70 percent (%), or more or less. On the other hand, in the case of FIG. 9, the conduction area ratio decreases to about 50%.

Figure 10:
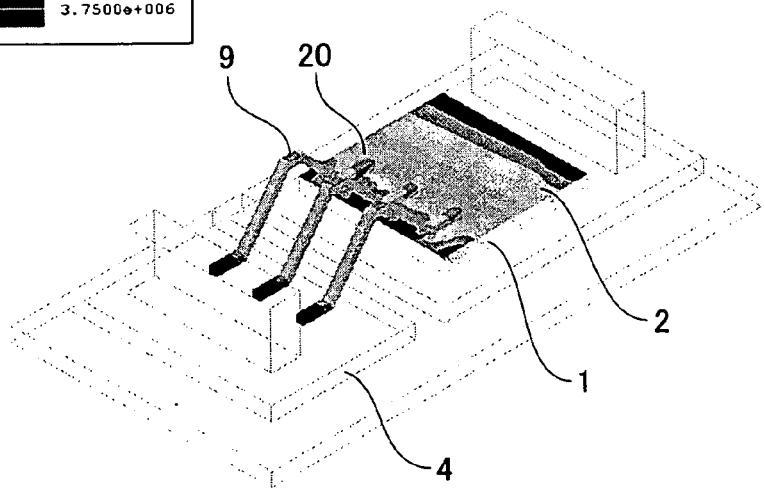
FIG. 10 shows a simulation result of current density distribution state.

Consequently in this embodiment, such decrease or dropdown of the conduction area ratio is prevented by enlarging the total thickness value of the electrode pad 20 and the electrode surface 2. More specifically, let the total thickness of electrode pad 20 and electrode surface 2 be greater than or equal to 10 μm or more, which is thicker by 5 μm than that in the case of FIG. 9. FIG. 10 shows a current density distribution state in a case where the total thickness of electrode pad 20 and electrode surface 2 is set at 10 μm and the others are the same as those of FIG. 9. The resultant conduction area ratio obtained in this case is about 70%, which is comparable to FIG. 8. Furthermore, since the wires 9 are formed at edge portions of the chip 1, it is possible to enlarge the maximum conduction current per wire.

Figure 11:
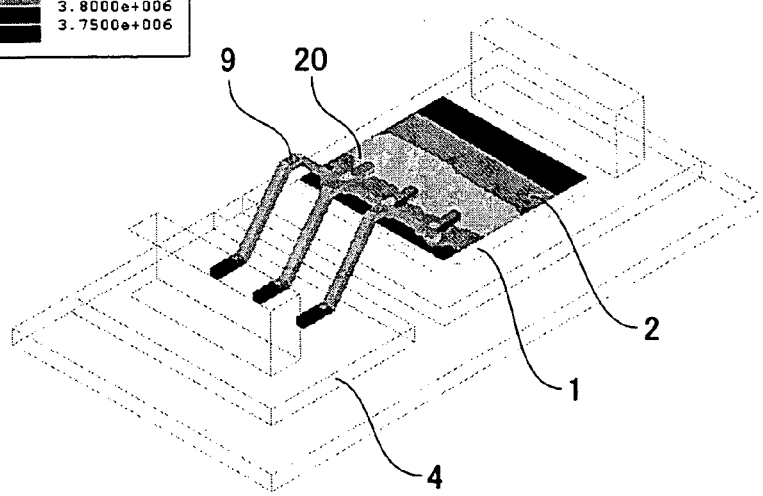
FIG. 11 shows a simulation result of current density distribution state.
Figure 12:
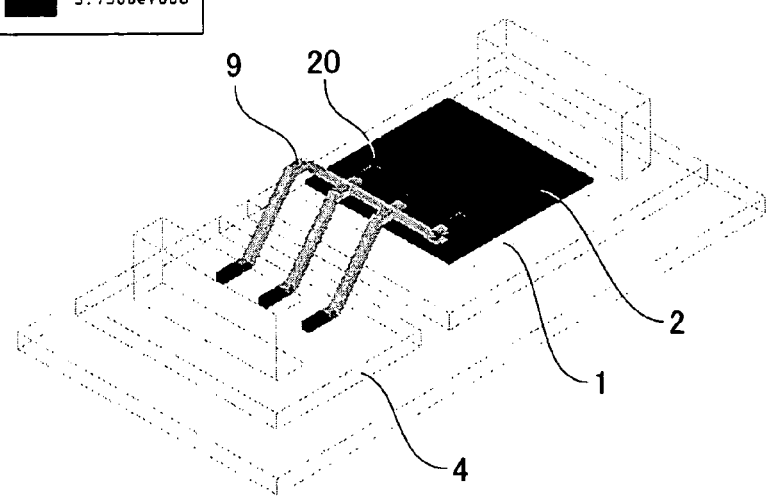
FIG. 12 shows a simulation result of current density distribution state.
Figure 13:
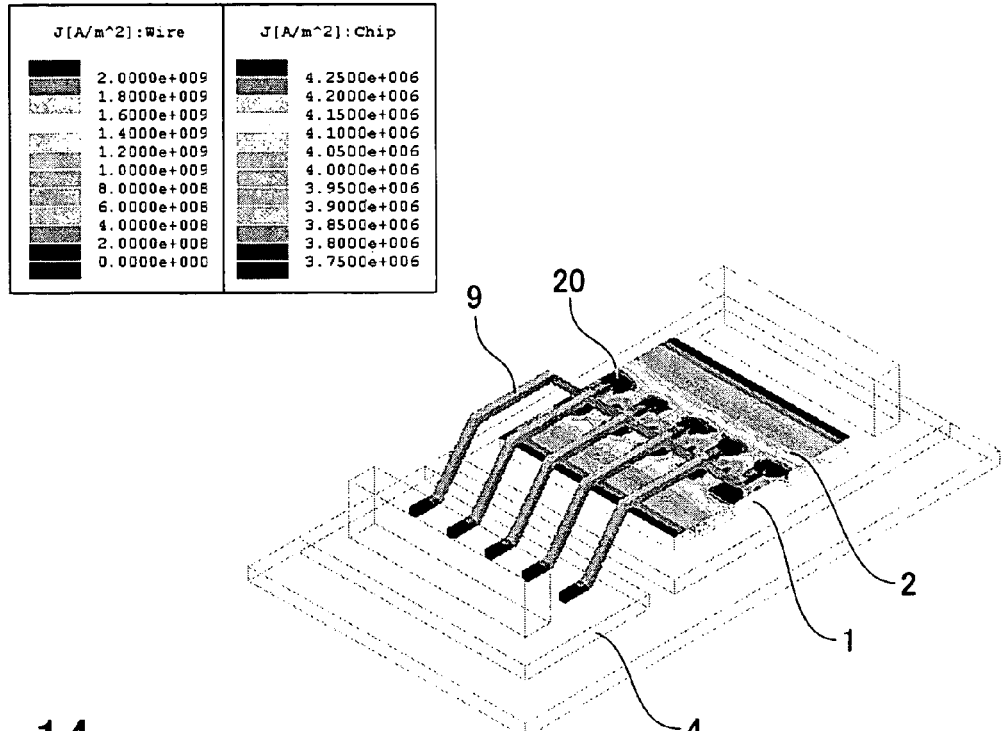
FIG. 13 shows a simulation result of current density distribution state.
Figure 14:
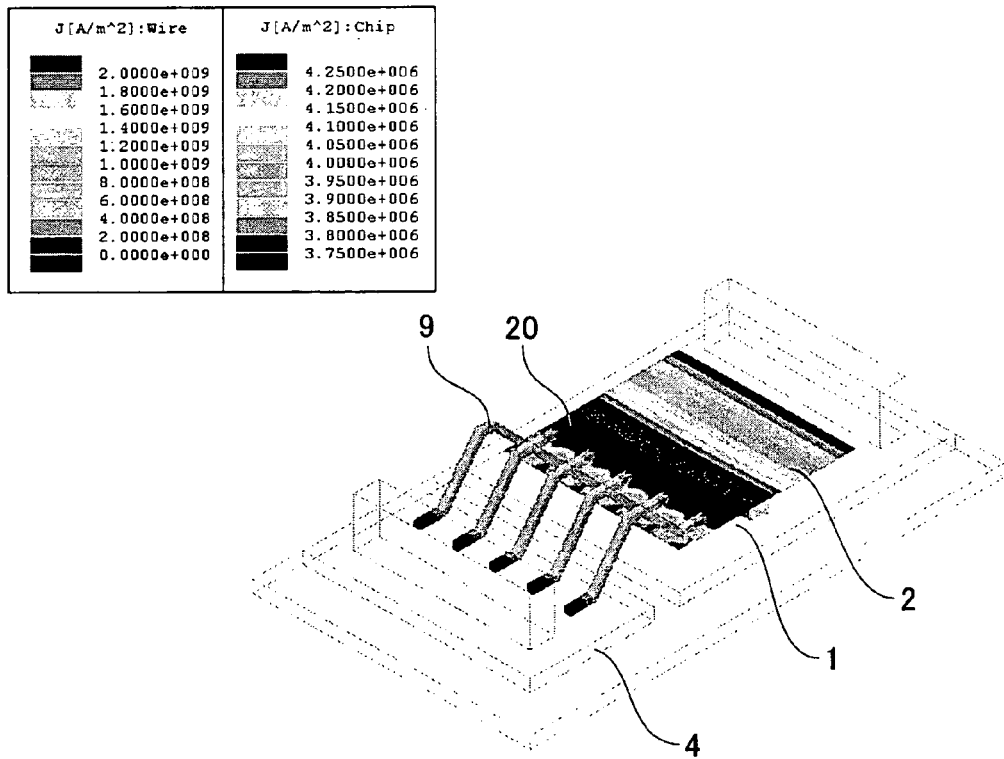
FIG. 14 shows a simulation result of current density distribution state.
Figure 15:
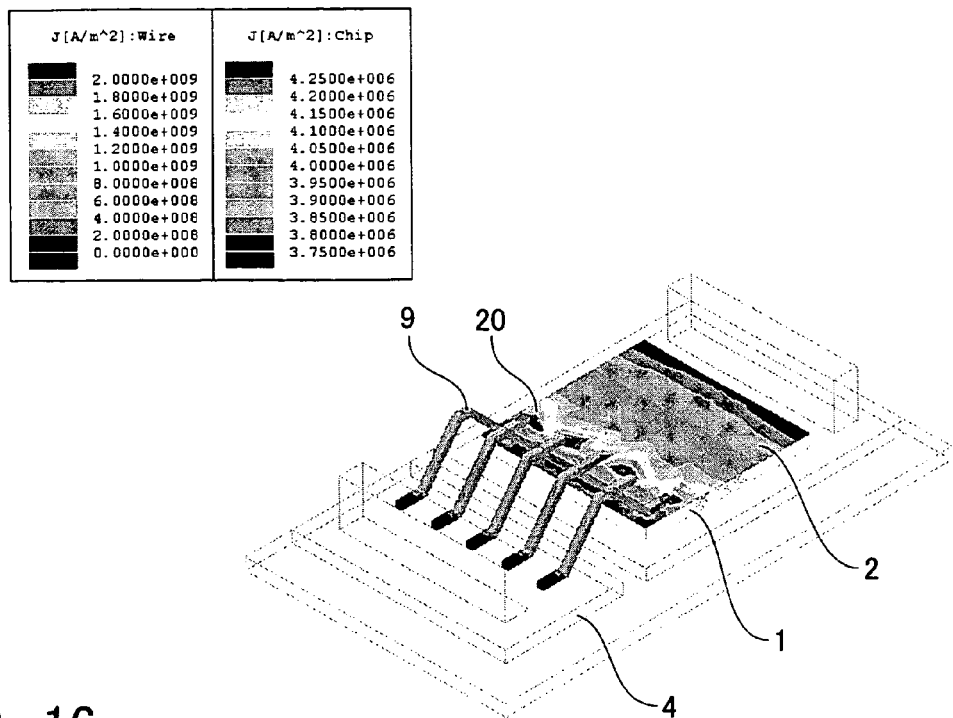
FIG. 15 shows a simulation result of current density distribution state.
Figure 16:
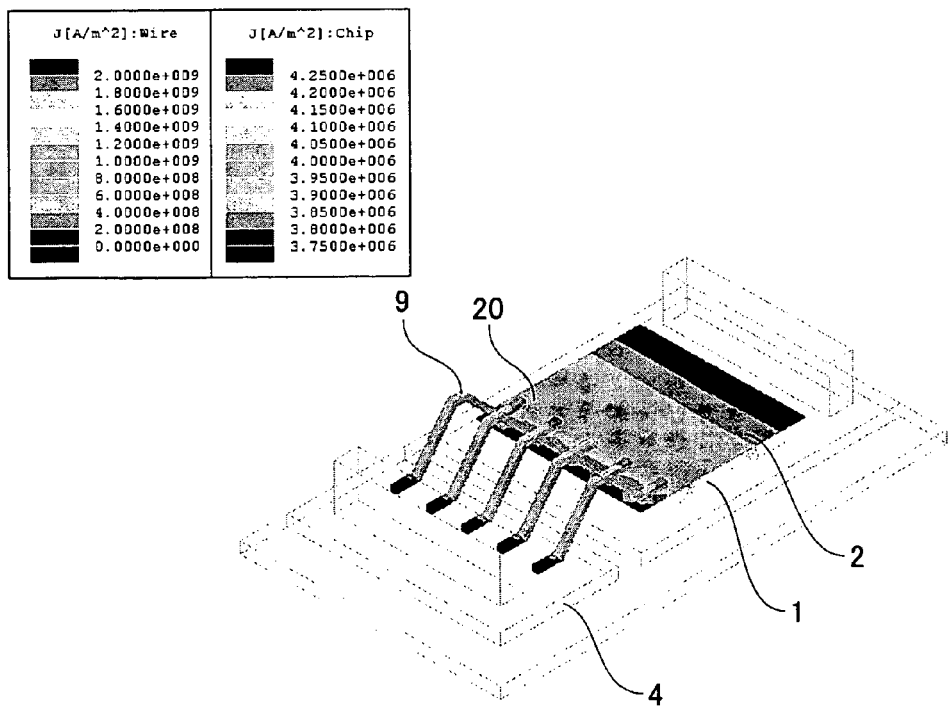
FIG. 16 shows a simulation result of current density distribution state.

FIGS. 11 and 12 show simulation results of a current density distribution state in cases where the total thickness of the electrode pad 20 and electrode surface 2 is set at 20 μm and 100 μm, respectively. In the case of FIG. 11, the conduction area ratio becomes about 90%, which is larger even when compared to the case of FIG. 8. In the case of FIG. 12 the conduction area ratio is almost 100%, with the distribution of current density becoming almost uniform and equal.

Although in FIGS. 8–12 specific cases are explained with the size of chip 1 and the thickness of wires 9 being set at the above-noted values, this invention should not be limited thereto. Even where these are set in a various ways, it is possible to set the total thickness of electrode pad 20 and electrode surface 2 in a similar way.

FIGS. 13–16 are current density distribution state simulation results in cases where the size of chip 1 is set larger than that in the cases of FIGS. 8–12 to measure 7 mm×7 mm, with the others being similar to those in FIGS. 8–12.

Figure 17:
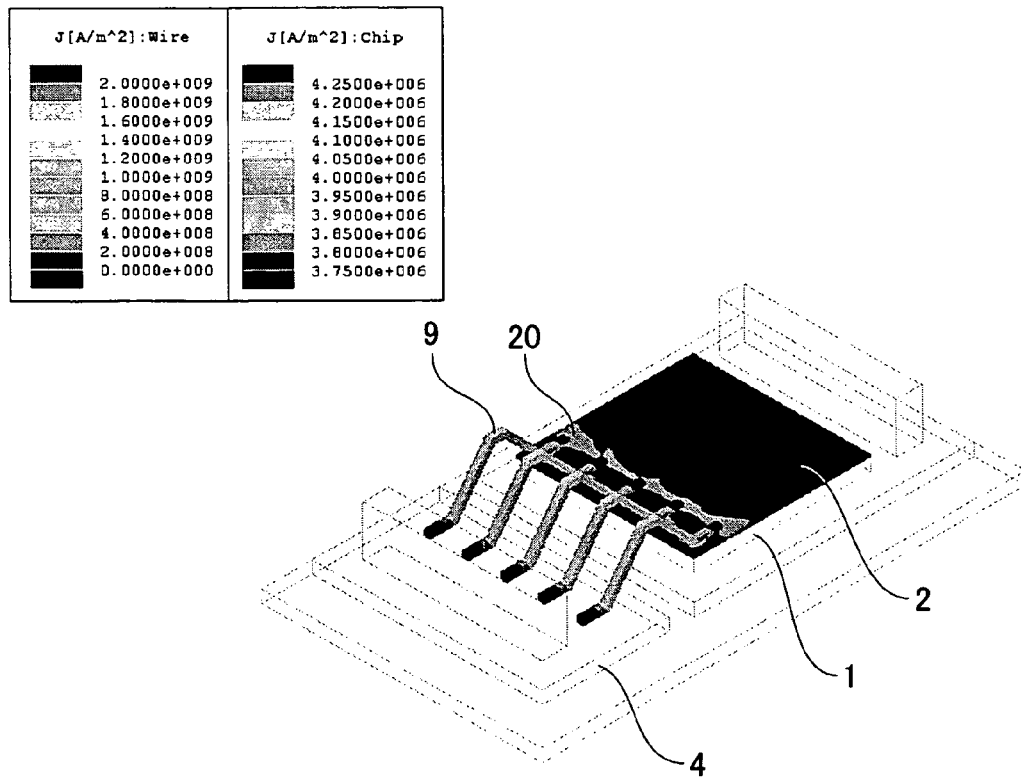
FIG. 17 shows a simulation result of a current density distribution state.

When compared to the case (FIG. 13) where electrode pads 20 are formed at the center of the electrode surface 2 and simultaneously the total thickness of electrode pad 20 and electrode surface 2 is set at 5 μm, in the case (FIG. 14) where the electrode pads 20 are formed at edge portions of the electrode surface 2 and simultaneously the total thickness of electrode pad 20 and electrode surface 2 is set at 5 μm, the conduction area ratio decreases (in the former, about 60%; in the latter, about 45%). However, when letting the total thickness of electrode pad 20 and electrode surface 2 be 10 μm which is larger by 5 μm than the case of FIG. 13, it is possible to permit the largeness of the conduction area ratio to be equal (about 60%) to or greater than that in the case of FIG. 13 (refer to FIGS. 15–17).

Figure 18:
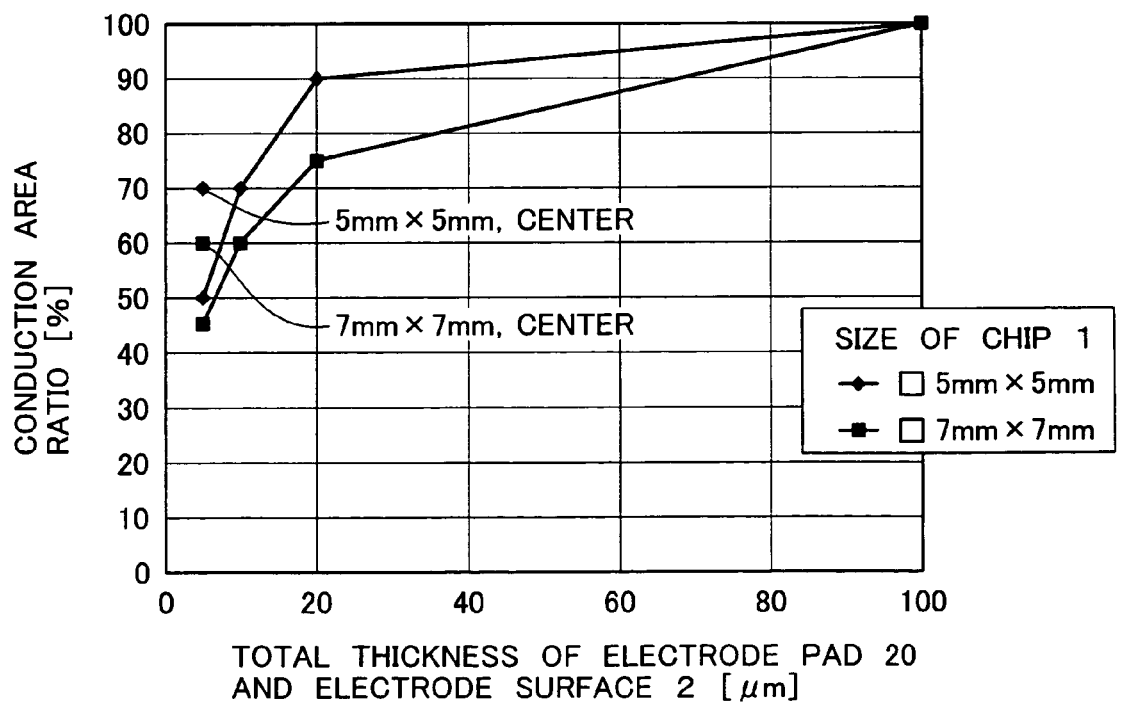
FIG. 18 is a graph showing the simulation results of FIGS. 8–17.

FIG. 18 represents, in form of a graph, the simulation results of FIGS. 8–17 (the relationship of the thickness of electrode pad 20 versus the conduction area ratio). In the case of the size of chip 1 being set at 5 mm×5 mm and in the case of the chip size of 7 mm×7 mm, the conduction area ratio of the former becomes slightly larger than the latter even when letting the other conditions (the thickness of wires 9, the electrode pads 20) be the same. This is because it becomes difficult for a current to effectively flow into portions far from the electrode pads 20, by a degree corresponding to an increase in size of chip 1. However, it can be seen that in each case, setting the total thickness of electrode pad 20 and electrode surface 2 at 10 μm or more makes it possible to obtain the intended conduction area ratio which is equivalent to or greater than that in the case where it is set at 5 μm with the electrode pads residing at or near the center of chip 1.

Figure 19:
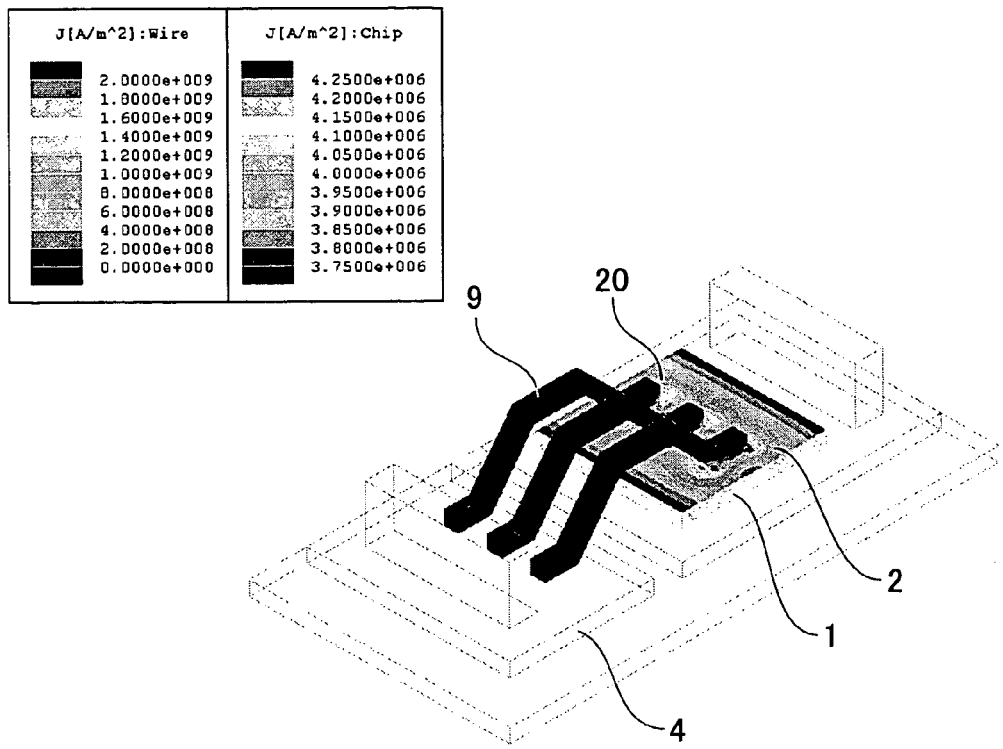
FIG. 19 shows a simulation result of a current density distribution state.
Figure 20:
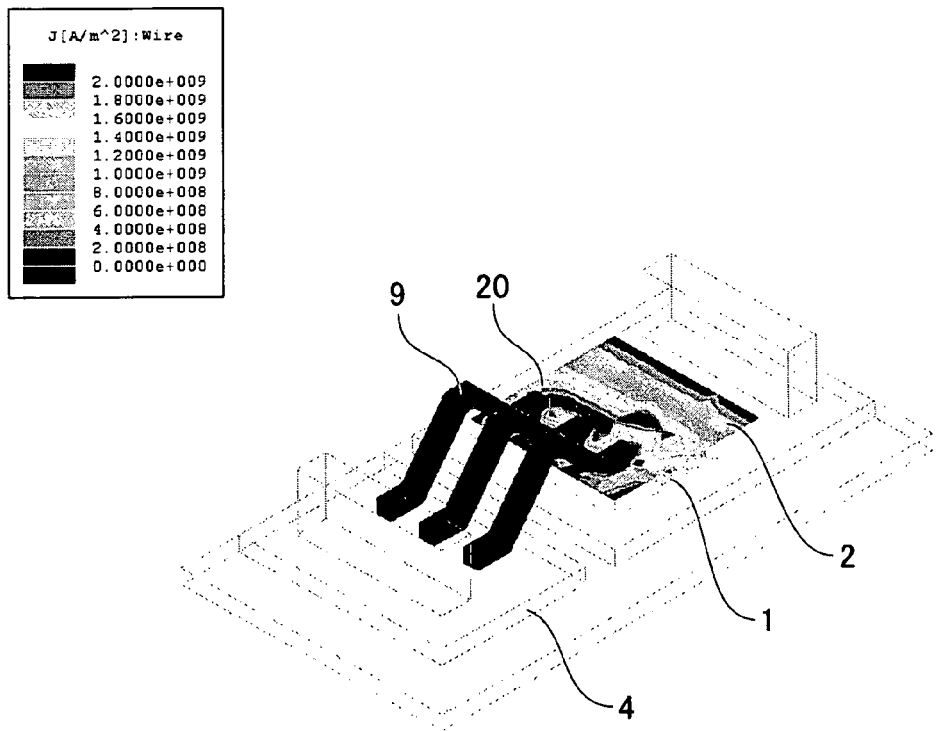
FIG. 20 shows a simulation result of current density distribution state.
Figure 21:
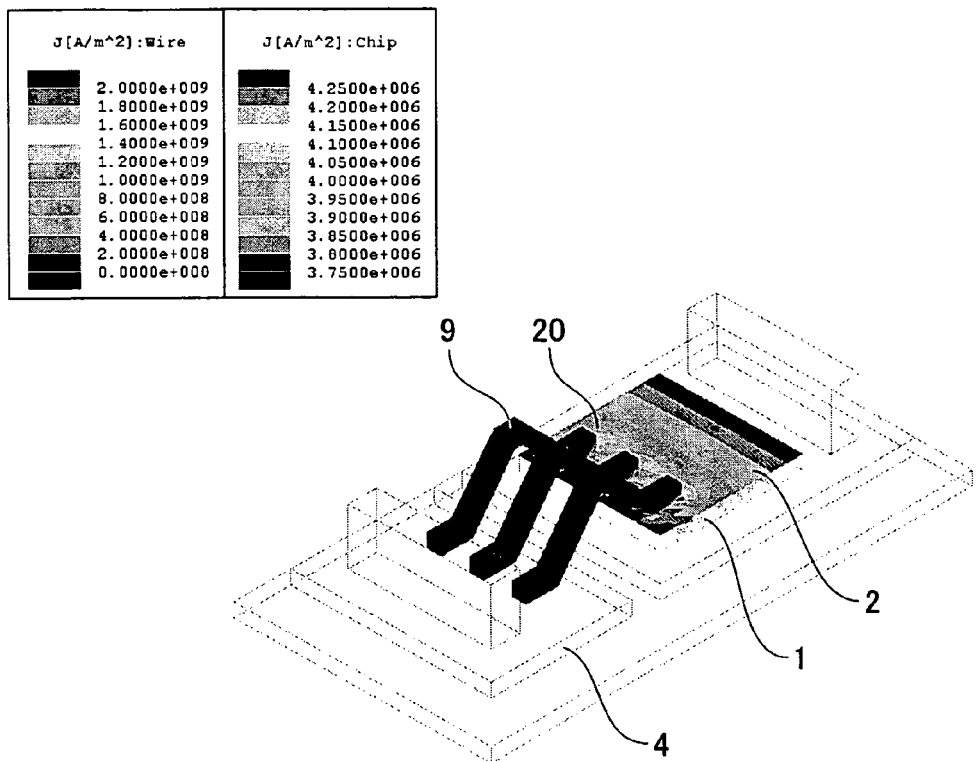
FIG. 21 shows a simulation result of current density distribution state.

FIGS. 19–21 are current density simulation results in case the thickness of wires 9 is set at 500 μm with the others being similar to those in FIGS. 8–12. Even in this case also, the case (FIG. 19) where the electrode pads 20 are formed at or near the center of electrode surface 2 with the total thickness of electrode pad 20 and electrode surface 2 being set at 5 μm and the case (FIG. 20) where the electrode pads 20 are formed at edge portions of electrode surface 2 with the total thickness of electrode pad 20 and electrode surface 2 being set at 5 μm are such that the former is about 80% in conduction area ratio whereas the latter becomes as low as about 60% in conduction area ratio. However it can be seen that even when forming the electrode pads 20 at the edge portions of electrode surface 2, the conduction area ratio equal to or greater than that in the case of FIG. 19 is obtainable by letting the total thickness of electrode pad 20 and electrode surface 2 be 10 μm or more (FIG. 21).

Figure 22:
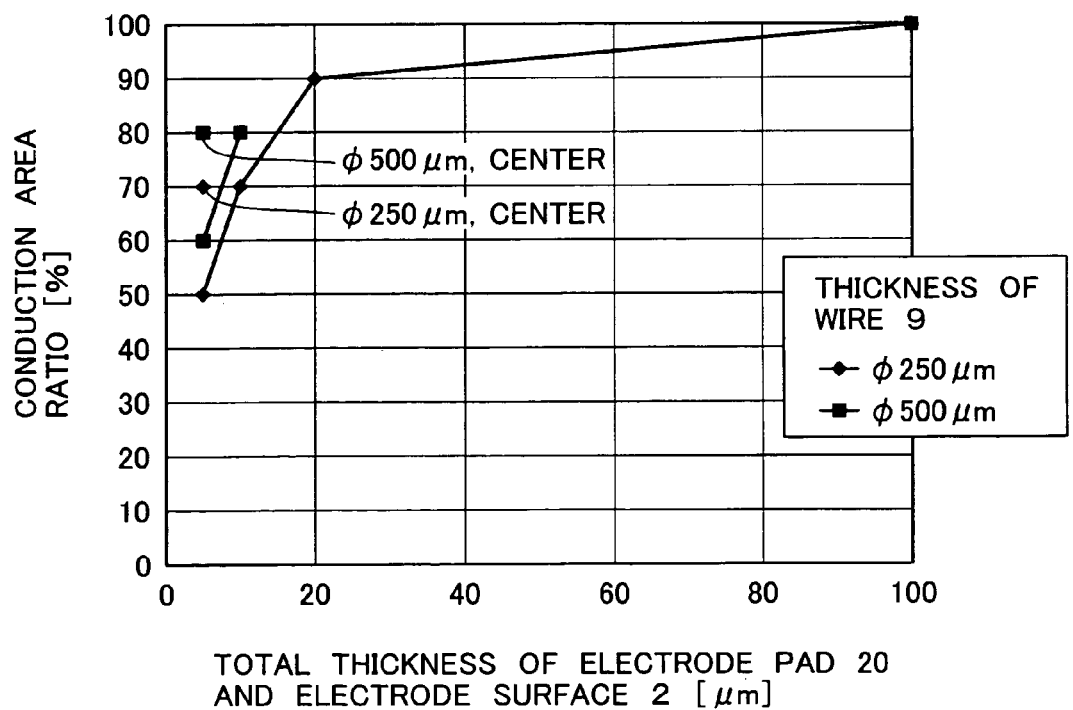
FIG. 22 is a graph showing the simulation results of FIGS. 19–21.

FIG. 22 graphically shows the simulation results of FIGS. 19–20. For comparison purposes, the simulation results of FIGS. 8–12 are plotted therein.

Although in FIGS. 8–17 and FIGS. 19–21 certain simulation results are indicated in case the electrode pads 20 and electrode surface 2 are formed using aluminum as their material, this invention is also applicable to other cases where they are made of material other than aluminum—for example, molybdenum (Mo). More specifically, it is possible to set up the total thickness of electrode pad 20 and electrode surface 2 which are made of molybdenum in such a way that the resulting conduction area ratio becomes equal to the conduction area ratio which is obtainable when the total thickness of electrode pad 20 and electrode surface 2 made of aluminum is set at 10 μm. The molybdenum is a metal which has its conductivity that is nearly half (½) of that of aluminum. Accordingly, setting the total thickness of molybdenum-based electrode pad 20 and electrode surface 2 at about 20 μm results in the chip 1 being given a conduction area ratio which is equivalent to that obtained in the case of the total thickness 10 μm of aluminum-based electrode pad 20 and electrode surface 2.

Even in the case of using other metals, the principal concept is the same. In the case of forming a respective one of the electrode surface 2 and the electrode pads 20 from a material with its conductivity C, the required thickness Te of the electrode surface 2 and the required thickness Tp of electrode pad 20 may be represented by the following Formula (2):

$$Te+Tp>=10\times Ca/C \text{ [μm]} \quad (2)$$

where Ca is the conductivity of aluminum.

The invention is also applicable to a case where the electrode pad 20 and the electrode surface 2 are made of mutually different materials.

Assume that the electrode surface 2 and the electrode pad 20 are made of different materials respectively—i.e., a material X with its conductivity Cx, and a material Y with conductivity Cy. In this case, the thickness Te of electrode pad 20 and the thickness Tp of electrode surface 2 may be given as the following Formula (3):

$$10\times Ca = <Cx\cdot Te + Cy\cdot Tp. \quad (3)$$

An example is that in case the electrode pad 20 is made of aluminum whereas the electrode surface 2 is made of molybdenum, it is possible for example to set the thickness of electrode pad 20 at 5 μm while setting the thickness of electrode surface 2 at 10 μm, respectively. With this setting, it is possible to obtain the conduction area ratio of chip 1 which is substantially equal to that in the case of forming both the electrode pad 20 and the electrode surface 2 using aluminum and setting the total thickness thereof at 10 μm.

Figure 23:
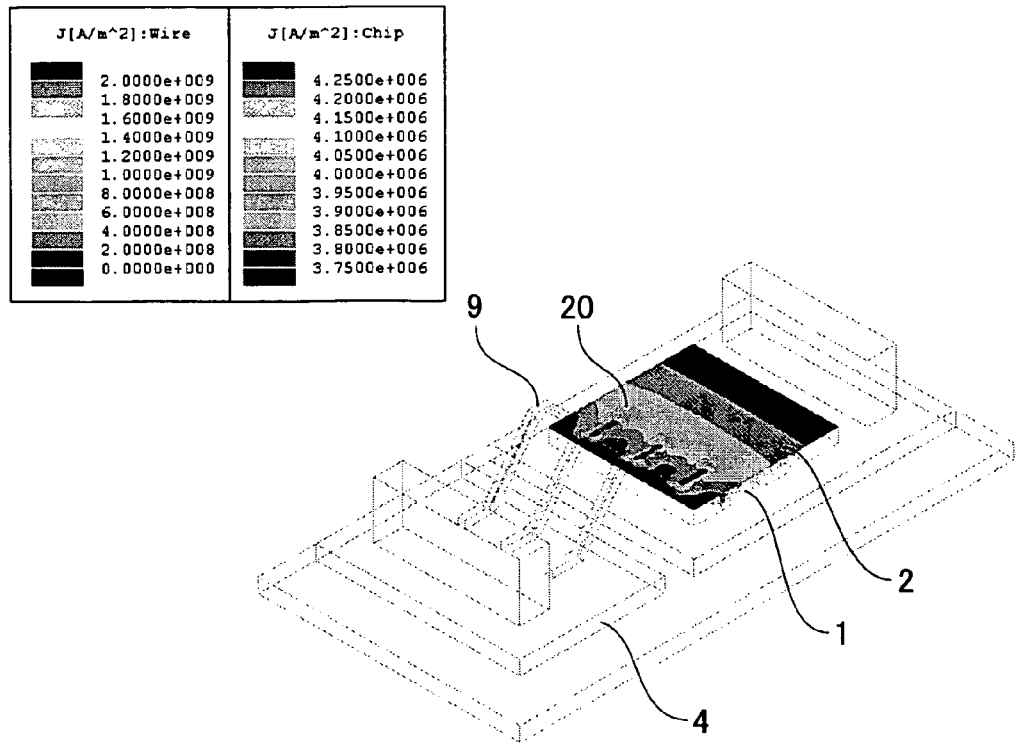
FIG. 23 shows a simulation result of a current density distribution state.

FIG. 23 is a current density distribution state simulation result in a case where the thickness of electrode pad 20 is set at 5 μm while the thickness of electrode surface 2 is at 10 μm (equivalent to the case of forming both the electrode pad 20 and electrode surface 2 by aluminum with their total thickness being set at 10 μm) with the others being the same as those in FIGS. 8–12. The current density distribution state is almost similar to that in the case of FIG. 10.

Figure 24:
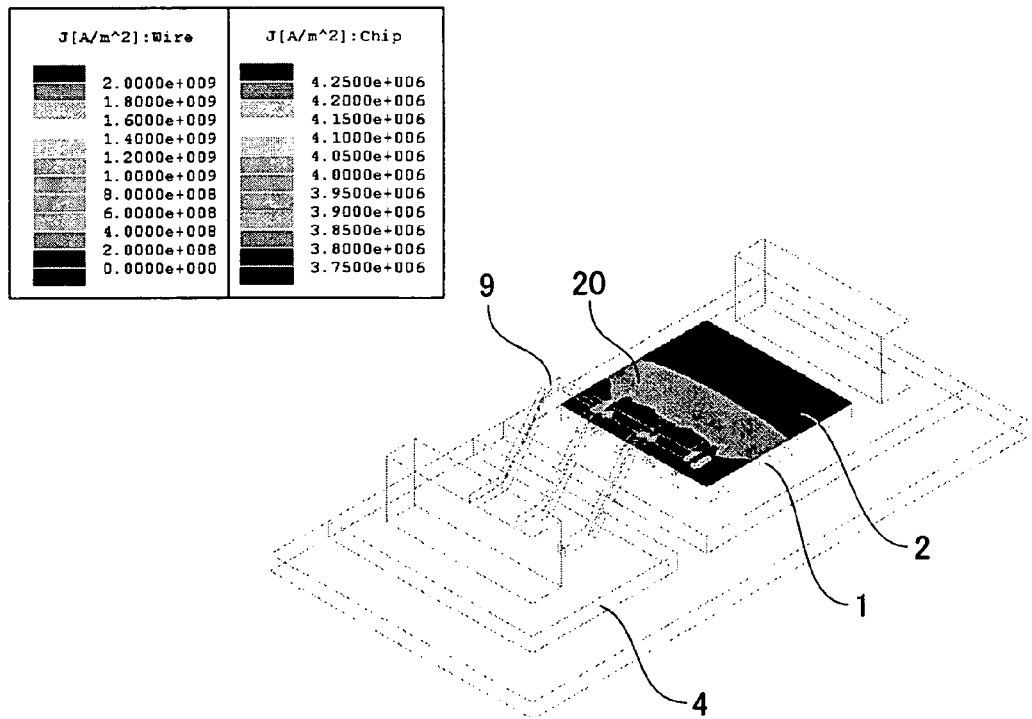
FIG. 24 shows a simulation result of current density distribution state.
Figure 25:
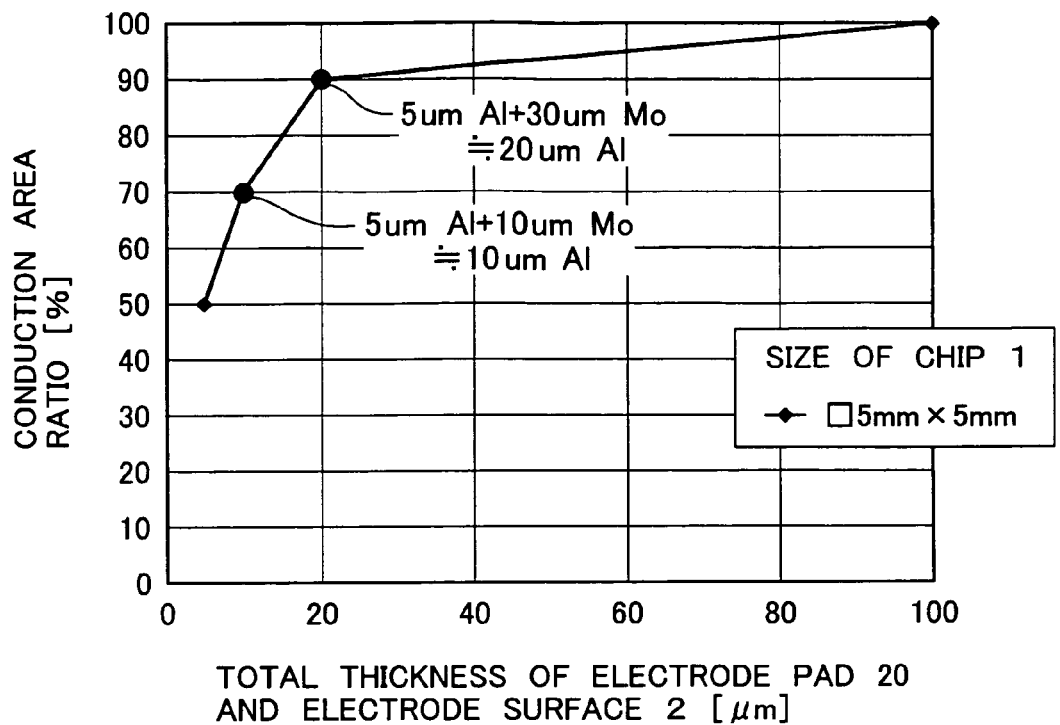
FIG. 25 is a graph showing the simulation results of FIGS. 23 and 24.
Figure 26:
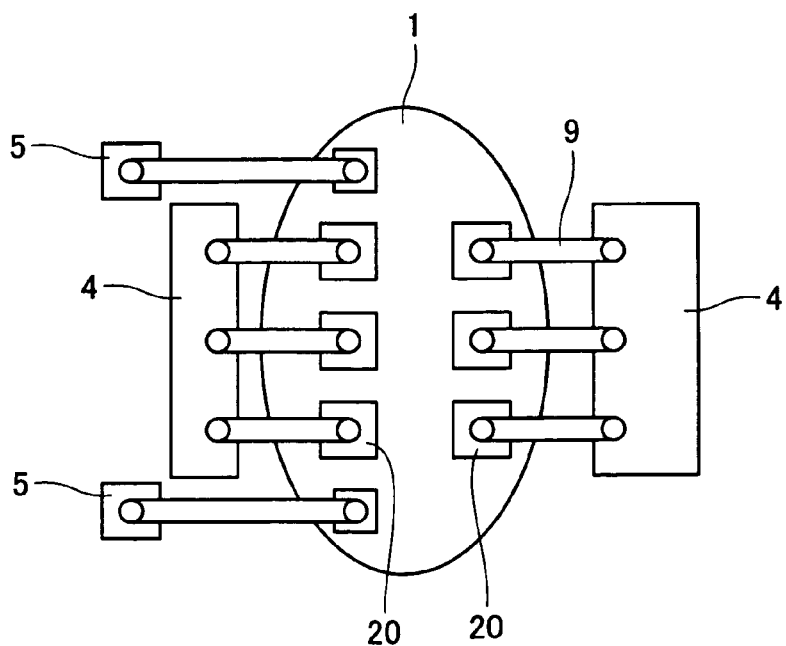
FIG. 26 shows a modification of the embodiment of the invention.

FIG. 24 shows a current density distribution state simulation result in a case where the thickness of electrode pad 20 is set at 5 μm whereas the thickness of electrode surface 2 is at 30 μm (equivalent to the case of forming both the electrode pad 20 and electrode surface 2 by aluminum with their total thickness being set at 20 μm) with the others being the same as those in FIGS. 8–12. The current density distribution state is such that a state obtained is similar to that in the case of FIG. 11. Shown in FIG. 25 is a graph indicating the simulation results of FIGS. 23 and 24. It can be seen that this becomes almost the same graph in form as the graph of FIG. 18.

Although embodiments of the invention have been described above, this invention is not limited thereto. A variety of alterations, additions and replacements are available within the scope which does not depart from the concept of the invention. For example, although in the above-stated embodiments the electrode surface 2 and the bonding wires 9 are indirectly connected together via the electrode pads 20, the invention is also applicable to those with the bonding wires 9 being directly connected to the electrode surface 2 without via any electrode pads 20. In this case, it is possible by changing the thickness of the electrode surface 2 to cause the conduction area ratio of chip 1 to change in value. In addition, although in the above embodiments the chip 1 is designed to have a regular tetragonal or square shape, it is apparent that this chip is modifiable to have other outer shapes, including but not limited to rectangles and ellipses. At this time, it may be recommendable to extend the bonding wires in a direction that crosses over the elongate direction in such outer shape of the chip 1. An example is that in case the outer chip shape is an ellipse, the bonding wires 9 are extended and drawn out in the direction crossing or "intersecting" the long diameter of the ellipse. This makes it possible to permit the bonding wires 9 to stay short in length.

What is claimed is:

1. A power semiconductor module comprising:
   a wide band gap semiconductor chip having a surface with an electrode provided thereon; and
   a bonding wire connected to an edge portion of said electrode directly or indirectly via an electrode pad,
   wherein said electrode and said electrode pad have thickness values as set in such a way as to obtain a conduction area ratio equal to or greater than a conduction area ratio of said wide band gap semiconductor chip in case a respective one of said electrode and said electrode pad is formed of aluminum while letting a total thickness value of said electrode and said electrode pad be ten micrometers (10 μm).

2. A power semiconductor module comprising:
   a wide band gap semiconductor chip having a surface with an electrode provided thereon; and
   a bonding wire connected to an edge portion of said electrode directly or indirectly via an electrode pad,
   wherein
   said electrode is made of a material with a conductivity Cx whereas said electrode pad is made of a material with a conductivity Cy, and a thickness Te of said electrode and a thickness Tp of said electrode pad are determined to satisfy:

$$10 \times Ca = < Cx \cdot Tp + Cy \cdot Te,$$

where Ca is a conductivity of aluminum.

3. The power semiconductor module according to claim 2, wherein each of said electrode and said electrode pad is made of aluminum, and wherein
the thickness Te of said electrode and the thickness Tp of said electrode pad are determined to satisfy:

$$Te + Tp >= 10,$$

where Ca is the conductivity of aluminum.

4. The power semiconductor module according to claim 2, wherein said bonding wire is taken out in a plurality of directions when looking at from said wide band gap semiconductor chip.

5. The power semiconductor module according to claim 2, wherein said bonding wire is taken out in a direction crossing an elongate directional side of said wide band gap semiconductor chip.

6. The power semiconductor module according to claim 2, wherein said bonding wire is taken out in a plurality of directions when looking at from said wide band gap semiconductor chip, said directions crossing an elongate directional side of said wide band gap semiconductor chip.

7. The power semiconductor module according to claim 2, wherein said wide band gap semiconductor chip is formed to have an elliptical shape, and wherein said bonding wire is taken out in a direction crossing a long diameter of said elliptical shape.

8. A power semiconductor module comprising:
a wide band gap semiconductor chip having a surface with an electrode provided thereon;
a bonding wire as electrically connected to an edge portion of said electrode;
an electrode pad interposed between said electrode and said bonding wire,
wherein thicknesses of said electrode and said electrode pad are determined in such a way as to obtain a conduction area ratio equal to or greater than a conduction area ratio of said wide band gap semiconductor chip in case each of said electrode and said electrode pad is made of aluminum while letting a total value of the thicknesses of said electrode and said electrode pad be 10 μm.

* * * * *